United States Patent
Kunard et al.

(10) Patent No.: US 10,453,706 B2
(45) Date of Patent: Oct. 22, 2019

(54) METHODS AND DEVICES FOR MINIATURIZATION OF HIGH DENSITY WAFER BASED ELECTRONIC 3D MULTI-CHIP MODULES

(71) Applicant: The Charles Stark Draper Laboratory, Inc., Cambridge, MA (US)

(72) Inventors: Keith N. Kunard, St. Petersburg, FL (US); Justin C. Borski, Bradenton, FL (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 0 days.

(21) Appl. No.: 14/573,219

(22) Filed: Dec. 17, 2014

(65) Prior Publication Data

US 2016/0183391 A1  Jun. 23, 2016

(51) Int. Cl.

| | |
|---|---|
| H05K 5/00 | (2006.01) |
| H01L 25/00 | (2006.01) |
| H05K 13/00 | (2006.01) |
| H05K 13/04 | (2006.01) |
| H05K 5/02 | (2006.01) |
| H01L 25/10 | (2006.01) |
| H01L 21/56 | (2006.01) |
| H01L 23/00 | (2006.01) |
| H01L 23/31 | (2006.01) |

(52) U.S. Cl.
CPC .......... *H01L 21/565* (2013.01); *H01L 21/568* (2013.01); *H01L 23/3107* (2013.01); *H01L 24/96* (2013.01); *H01L 25/50* (2013.01); *H01L 2224/04105* (2013.01); *H01L 2924/14* (2013.01); *H01L 2924/1461* (2013.01)

(58) Field of Classification Search
CPC ...... H01L 21/565; H01L 25/50; H01L 25/105
USPC ....................................................... 361/729
See application file for complete search history.

(56) References Cited

U.S. PATENT DOCUMENTS

| | | | | |
|---|---|---|---|---|
| 5,904,502 | A | * | 5/1999 | Ference ................. H01L 21/56 257/E21.502 |
| 7,939,916 | B2 | * | 5/2011 | O'Donnell ............ H01L 21/561 257/659 |
| 8,237,259 | B2 | * | 8/2012 | Pressel ................... H01L 24/19 257/678 |

(Continued)

*Primary Examiner* — Rockshana D Chowdhury
(74) *Attorney, Agent, or Firm* — Womble Bond Dickinson (US) LLP; John J. Penny, Jr.

(57) ABSTRACT

Techniques for constructing a multi-chip module semiconductor device are provided herein. The techniques include placing electronic modules on a first surface and a second surface, with electrical connections for the electronic modules being proximate to respectively mounted surfaces, disposing a mold material on one of the mounting surfaces to substantially surround corresponding electronic modules, orienting the mounting surface without the mold material disposed thereon, relative to the mounting surface with the mold material disposed thereon to cause the mold material to substantially surround each electronic module while maintaining a minimum distance between the electronic modules mounted on each mounting surface. The techniques further include removing the mounting surfaces from the mold compound to yield a multi-chip semiconductor device.

6 Claims, 8 Drawing Sheets

(56) References Cited

U.S. PATENT DOCUMENTS

| | | | |
|---|---|---|---|
| 2008/0009097 A1* | 1/2008 | Lim | H01L 21/568 438/109 |
| 2012/0146177 A1* | 6/2012 | Choi | H01L 25/16 257/528 |
| 2013/0069239 A1* | 3/2013 | Kim | H01L 23/49827 257/774 |

* cited by examiner

METHODS AND DEVICES FOR MINIATURIZATION OF HIGH DENSITY WAFER BASED ELECTRONIC 3D MULTI-CHIP MODULES

TECHNICAL FIELD

The present disclosure relates generally to wafer based electronic modules that may include a variety of semiconductor devices, memory devices, passive electronic devices, RF devices, MEMS, and, more particularly, to improved miniaturization through the use of 3D space utilization for high density wafer based multi-chip modules.

BACKGROUND

High density electronic packages often referred to as multi-chip modules (MCM) or so-called systems in a package (SiP) have been designed and fabricated to satisfy the increasing demand for high levels of functionality in small packages. Products that may be combined within the these electronic packages include memory, digital logic, analog and digital processing devices, and analog Radio Frequency (RF) circuits, passives, sensors, FPGA, MEMS, etc. Typical integration of high density electronic devices achieves a density that is many times greater than, for example, surface mount technology (SMT).

Conventional fabrication techniques for these high density electronic devices include, for example, forming electronic modules such as integrated circuits, Through Substrate Vias (TSVs), and the like, positioning the electronic components on a mounting surface, encapsulating the resulting arrayed electronic modules in a mold material, forming one or more electrical layers along surfaces of the mold material (e.g., top-side electrical layers, bottom-side electrical layers, etc.) to yield a resultant reconstituted wafer fabrication based module. Typically, depending on the application, multiple wafer fabrication based modules are stacked together to form more complex electronic components according to application requirements, with the stacking done at either wafer or at individual module level. However, per module, the underlying chip density remains limited by relative placement and orientation of the contained electronic devices within the modules relative to a single 2D mounting surface. Accordingly, a need remains for devices and fabrication techniques that improve space utilization via 3D integration for each wafer based multi-chip module.

SUMMARY

In accordance with one or more embodiments described herein, this disclosure provides methods, devices, and techniques for reducing overall package thickness, cost, and processing time for wafer based electronic multi-chip modules. According to these one or more embodiments, electronic modules are encapsulated facing away on two opposing sides (e.g., back-to-back) of a wafer based multi-chip module. Subsequent circuit layers, including di-electric layers, interconnection layers, and the like, can be formed on the two opposing sides of the wafer based module, as is appreciated by those skilled in the art. By using two opposing sides of the wafer based module, stacking individual modules to achieve certain design requirements is obviated. Put differently, the techniques disclosed herein provide for improved space utilization by incorporating multiple electronic modules into a single three dimensional MCM at wafer level.

According to another embodiment, the fabrication techniques for a wafer based module, e.g., a semiconductor device, include determining a volume associated with one or more electronic modules. Electronic modules include die, integrated circuits (ICs), passive electronic components, Through Substrate Vias (TSVs), and the like. Typical implementations will use a filling material between these aforesaid components, providing the resultant multi-chip module with a complete form. Additionally, the various materials that each electronic module is made of versus the filler material may have one or more thermal expansion coefficients. Depending on these thermal expansion co-efficient and the corresponding volume of the electronic module, the electronic modules increase or decrease in size during certain fabrication processes (e.g., curing at high temperatures) due to further mismatch with the substrate material. In turn, this change or delta in size can cause undesired bowing or flexing in a resultant multi-chip module device. Accordingly, the 3D volume for electronic multi-chip modules is one metric used to proportionally distribute electronic components in a mold material thereby mitigating undesired bowing or flexing.

Moreover, according to this embodiment, the fabrication techniques provide for placing at least one electronic module on a first mounting surface such that one or more electrical connections are proximate the first mounting surface (e.g., face-down) and placing at least one additional electronic module on a second mounting surface such that one or more electrical connections are proximate the second mounting surface (e.g., again, face-down orientation relative to the second mounting surface). Optionally, in certain instances, perimeter coordinates can be defined on the second mounting surface for an electronic module placed on the first mounting surface. For example, if the electronic module on the first mounting surface is a TSV, the perimeter coordinates on the second mounting surface outline where a portion of the TSV will occupy when the first mounting surface and the second mounting surface are oriented relative to a mold material, discussed in greater detail below. It is appreciated that these perimeter coordinates can be mapped for any electronic module placed on a mounting surface (first or second mounting surfaces) and are defined in the corresponding mounting surface (second or first mounting surfaces, respectively). In preferred embodiments, the at least one electronic module placed on the first mounting surface and the at least one additional electronic module placed on the second mounting surface are releasable yet secured to respective mounting surfaces during the fabrication process using, for example, a bonding agent.

Once the electronic modules are placed on respective mounting surfaces, a mold barrier is placed on one of the mounting surfaces. The mold barrier serves as a barrier or seal to a subsequently dispensed mold material and, once the mold material is cured, the mold barrier defines at least one outer surface of the resultant wafer based modules. As mentioned, mold material is placed on either the first mounting surface or the second mounting surface (e.g., within the mold barrier). The mold material is disposed on the mounting surface—here, the first mounting surface—and substantially surrounds each electronic module placed on the mounting surface. The mounting surface without the mold barrier—here, the second mounting surface—is oriented (with each additional electronic module) relative to the first mounting surface and the mold material to cause the mold material to substantially surround each additional electronic module while maintaining a minimum distance between each additional electronic module placed on the second mounting surface and each electronic module placed on the first mounting surface. Put differently, the second mounting surface, including the releasably secured electronic modules is oriented to sandwich the mold material between itself and the first mounting surface. In certain embodiments, alignment pins and receptacles are associated with the mounting surfaces to ensure proper placement during this orientation step. Once properly aligned, additional fabrication steps are performed to cure the mold material. Notably, these additional fabrication steps also cause the electronic modules to de-bond from respective mounting surfaces. After curing, the mounting surfaces and mold barrier are removed from the mold material to yield a wafer device having a first surface defined by removal of the first mounting surface, and a second surface defined by removal of the second mounting surface opposite the first surface, sometimes referred to as a bottom surface and a top surface, or a front surface and a back surface, respectively. In some embodiments, additional steps can be performed to remove portions of the mold material, using for example, subtractive processing, milling, routing, and the like, from the bottom surface and/or top surface to expose portions of underlying electronic modules, e.g., TSVs. Other fabrication processes can include forming one or more interconnection layers along at least one of a top surface and a bottom surface of the wafer based modules, and also dicing operations to cut-up the resultant semiconductor device into sub-devices, as appropriate. This disclosure also provides for wafer based modules or semiconductor devices made by the same process.

In certain other embodiments, a wafer based module is described. The wafer based module includes at least one electronic module, e.g., die, TSVs, passive electronic devices, etc., having one or more electrical connections oriented proximate a bottom surface of the wafer based module, at least one additional electronic module having one or more electrical connections oriented proximate a top surface of the wafer based module, and a mold material unitarily formed to substantially surround each of the at least one electronic module and each of the at least one additional electronic module, the mold material defining the bottom surface and the top surface of the wafer based module. According to this embodiment, the wafer based module also includes one or more metallic layers formed on each of the bottom surface and the top surface, the one or more metallic layers coupled to corresponding portions of the electrical connections of the at least one electronic module and the at least one additional electronic module. Optionally, the mold material can be further formed and defined by a ring mold or other mold barrier/seal. Additionally, the electronic modules can be disposed within the mold material according to a volume based distribution to mitigate undesired bowing or flexing.

Further, the subject technology can use semiconductor wafer fabrication technologies for a plurality of modules on the same wafer consequently achieving a volume production in the form of reconstituted wafers whereby many modules are arrayed onto a single substrate.

It should be appreciated that the present technology can be implemented and utilized in numerous ways, including without limitation as a process, an apparatus, a system, a device, a method for applications now known and later developed or a computer readable medium. These and other unique features of the technology disclosed herein will become more readily apparent from the following description and the accompanying drawings.

BRIEF DESCRIPTION OF THE DRAWINGS

So that those having ordinary skill in the art to which the disclosed technology appertains will more readily understand how to make and use the same, reference may be had to the following drawings.

FIGS. 9A and 9B together illustrate an exemplary procedure for forming a semiconductor device in accordance with one or more embodiments disclosed herein.

A component or a feature that is common to more than one drawing is indicated with the same reference number in each of the drawings.

DESCRIPTION OF EXEMPLARY EMBODIMENTS

The present disclosure overcomes many of the prior art problems associated with higher density wafer based multichip modules. The advantages, and other features of the systems and methods disclosed herein, will become more readily apparent to those having ordinary skill in the art from the following detailed description of certain preferred embodiments taken in conjunction with the drawings which set forth representative embodiments of the present invention and wherein like reference numerals identify similar structural elements.

All relative descriptions herein such as left, right, up, and down are with reference to the Figures, and not meant in a limiting sense. Additionally, for clarity common items and circuitry such as resistors, capacitors, transistors, and the like, have not been included in the Figures as would be appreciated by those of ordinary skill in the pertinent art. Unless otherwise specified, the illustrated embodiments can be understood as providing exemplary features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed systems or methods. Additionally, the shapes and sizes of components are also exemplary and unless otherwise specified, can be altered without materially affecting or limiting the disclosed technology.

Wafer based multi-chip modules, including high density electronic devices, are typically formed by fabricating a reconstituted wafer with embedded electronic modules (e.g., chip scale components) using a molding process. Importantly, most embedded chip scale components, referred to as electronic modules, include various circuitry contained within a housing and electrical contacts along one surface of the housing (e.g., a bottom surface). During conventional molding processes, the desired chip scale components are typically oriented on a mounting surface with the electrical contacts facing upward or downward relative to the mounting surface. That is, the electrical contacts along the surface of the housing are located on a housing surface proximate the mounting surface or on a housing surface opposite thereof. Typically, the electronic contacts are oriented proximate the mounting surface in order to electrically connect the electrical contacts to conductive material during subsequent fabrication steps—e.g., dielectric layers, top and bottom side interconnect structures, and the like.

Figure 1A:
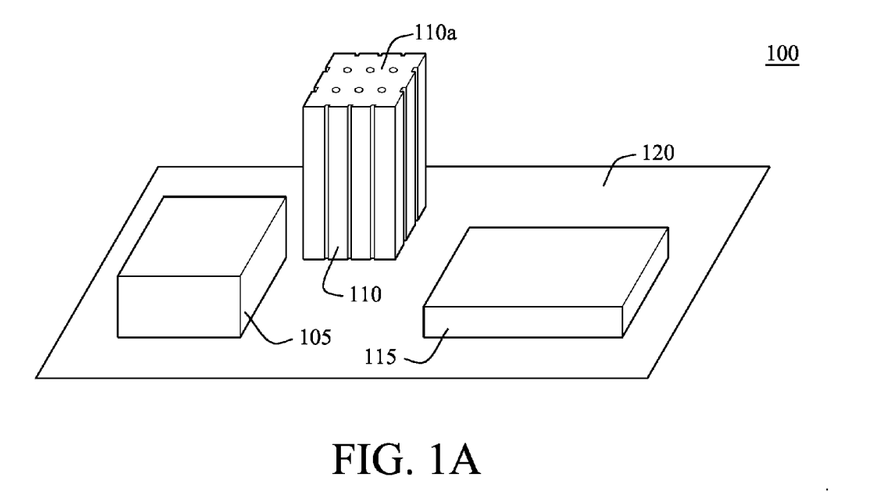
FIG. 1A illustrates a perspective view of various electronic modules oriented on a mounting surface.
Figure 1B:
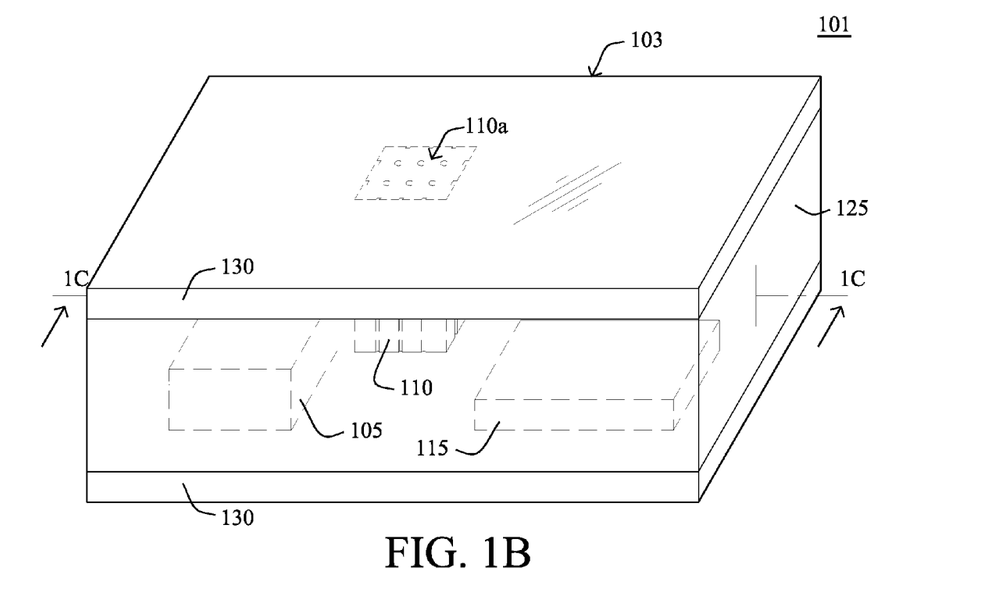
FIG. 1B illustrates a perspective view of the electronic modules shown in FIG. 1 encapsulated in a mold material.
Figure 1C:
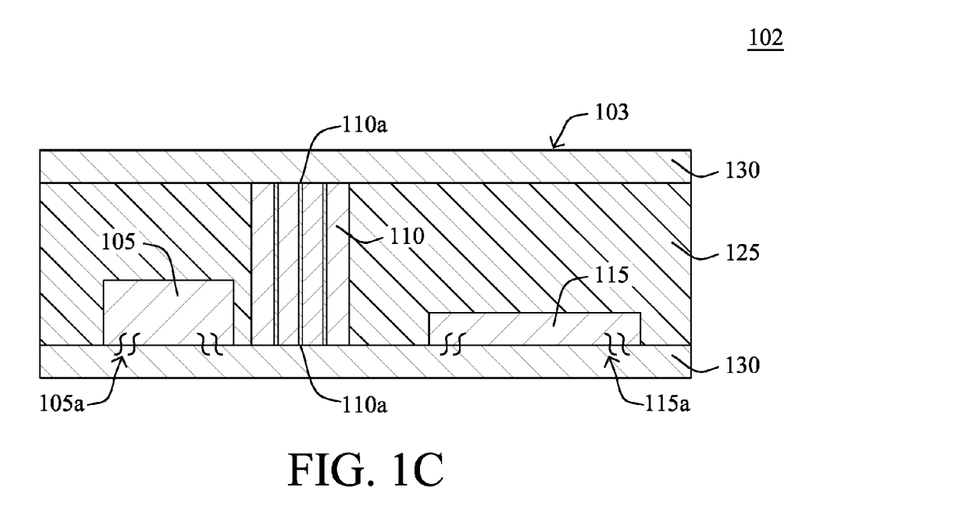
FIG. 1C illustrates a cross sectional elevation view of the mold material shown in FIG. 1B taken viewed from cut lines 1C.

FIGS. 1A-1C, collectively, illustrate an exemplary fabrication process for a wafer based module 102 such as a semiconductor device. In particular, FIG. 1A illustrates a perspective view 100 of various electronic modules, labeled as shown—modules "105", "110", and "115"—oriented on a mounted surface 120 such that electronic connections to each of the electronic modules are proximate mounting surface 120. Electronic modules, as disclosed herein, include, but are not limited to any electronic modules used in manufacturing a wafer based module or a semiconductor device. For example, the electronic modules can include micro-electromechanical (MEM) sensors, one or more die, integrated circuits (ICs), Through Substrate Vias (TSVs), and the like. It is also appreciated that the views shown in FIGS. 1A-1C are provided for purposes of discussion, and not limitation, where electronic modules 105 and 115 are die, and electronic module 115 is a TSV. Notably, electronic module 110 includes electrical contacts 110a on two opposing surfaces—one surface being proximate mounting surface 120 and an opposite surface as shown with exposed portions of the electrical contacts 110a.

FIG. 1B illustrates a perspective view of a resultant wafer based module 101, including the electronic modules 105, 110, and 115 encapsulated in a mold material 125. Additionally, two interconnection layers 130 are located along a top surface and a bottom surface of the wafer based module 101. As discussed above, such interconnection layers 130 generally couple or connect to electrical connections for each electronic module, as is appreciated by those skilled in the art. For example, electronic module 110, a TSV, provides electrical interconnections between the two interconnection layers 130.

FIG. 1C illustrates a cross sectional elevation view of the electronic module 101 shown in FIG. 1B, viewed from cut lines 1C. As discussed above, electronic module 110 is a through-substrate via (TSV) that electrically couples various interconnection layers—here interconnection layers 130—of the wafer based module 105. Additionally, view 102 illustrates electrical contacts 105a and 115a for respective electronic modules 105 and 115, respectively.

As discussed above, conventional approaches to achieve specified design requirements with wafer based modules include, for example, stacking individual wafer based modules together, to incorporate additional functionality of multiple electronic modules. However, the techniques described herein reduces (or even obviates) the need to stack multiple electronic modules by improving space utilization in a single fabricated wafer based module. In particular, these techniques, including devices made by the same, incorporate electronic modules on two opposing sides (e.g., back-to-back) of a wafer based module, such as a multi-chip module (MCM).

FIGS. 2-8 collectively illustrate various views of the improved space utilization techniques for wafer based modules.

Figure 2:
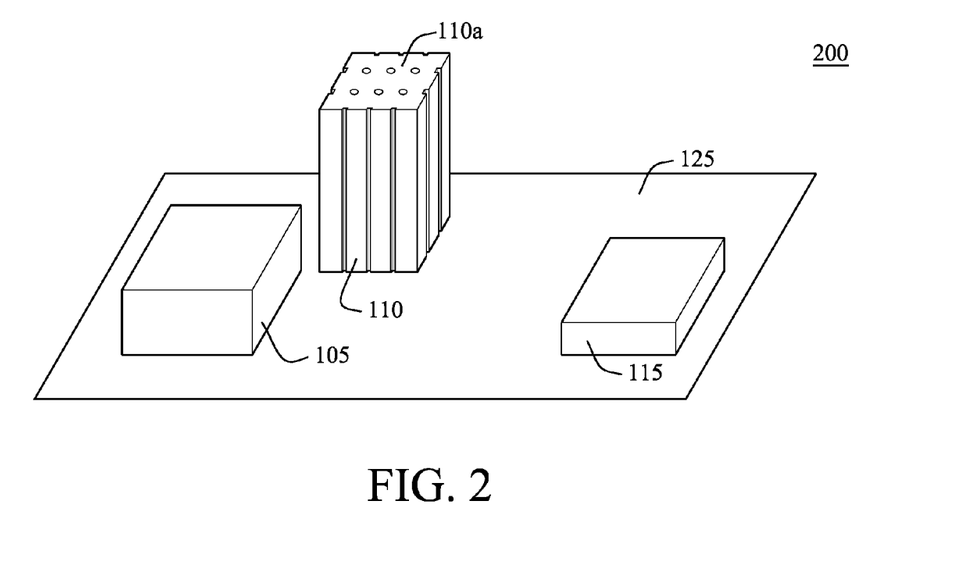
FIG. 2 illustrates a perspective view of various electronic modules oriented on a first mounting surface.

Referring to FIG. 2, a perspective view 200 is provided, showing a mounting surface 125, electronic modules 105, 110 and 115, and portions of exposed electrical connections 110a on electronic module 110. As discussed above, the electronic modules can include any type of electronic module suitable for the techniques described herein. As shown, electronic modules 105 and 115 are dies, and electronic module 110 is a Through Substrate Via (TSV).

Figure 3:
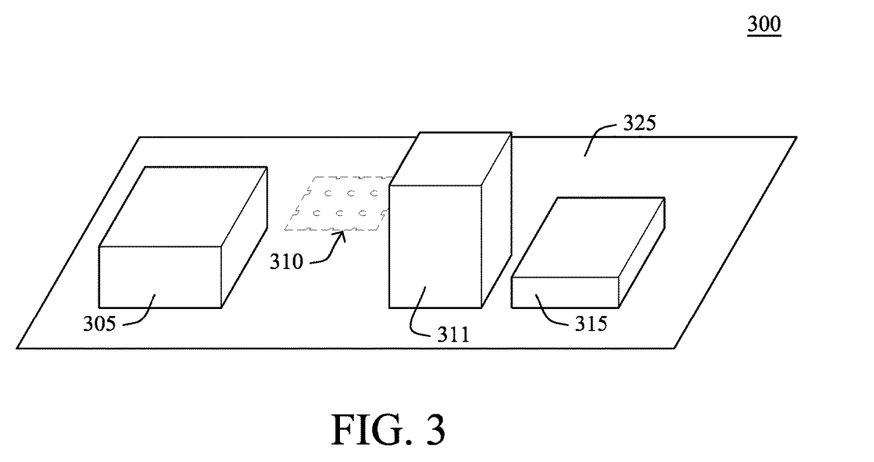
FIG. 3 illustrates a perspective view of various electronic modules oriented on a second mounting surface.

FIG. 3 illustrates a perspective view 300 of a second mounting surface 325, including respective electronic modules 305, 311 and 315 oriented thereon. Additionally, perspective view 300 shows one or more perimeter coordinates 310, outlines in a dash-line. Perimeter coordinates 310 are defined on the second mounting surface 325 and correspond to electronic module 110. As discussed in greater detail below, electronic modules 305, 311 and 315 will be incorporated into a single wafer based module on an opposing side to electronic modules 105, 110 and 115. Perimeter coordinates 310 provide a map for portions of electronic modules—here, electronic module 110—that prevents potential interference or obstruction when combining multiple electronic modules within a single mold material. Here, such perimeter coordinates 310 are particularly associated with electronic module 110, since electronic module 110 is a TSV that electrically couples opposing interconnection layers of a wafer based module. It is also appreciated that such perimeter coordinates can be interchangeably mapped for either (and for both) mounting surfaces.

Mounting surface 125 (FIG. 2), and mounting surface 325 (FIG. 3) can include, for example, carrier wafers, tape frames, masks, and the like. As discussed in greater detail below, these carrier wafers can include bonding agents such as thermal release tape that releasably secures respective electronic modules during various phases of the fabrication process.

Figure 4:
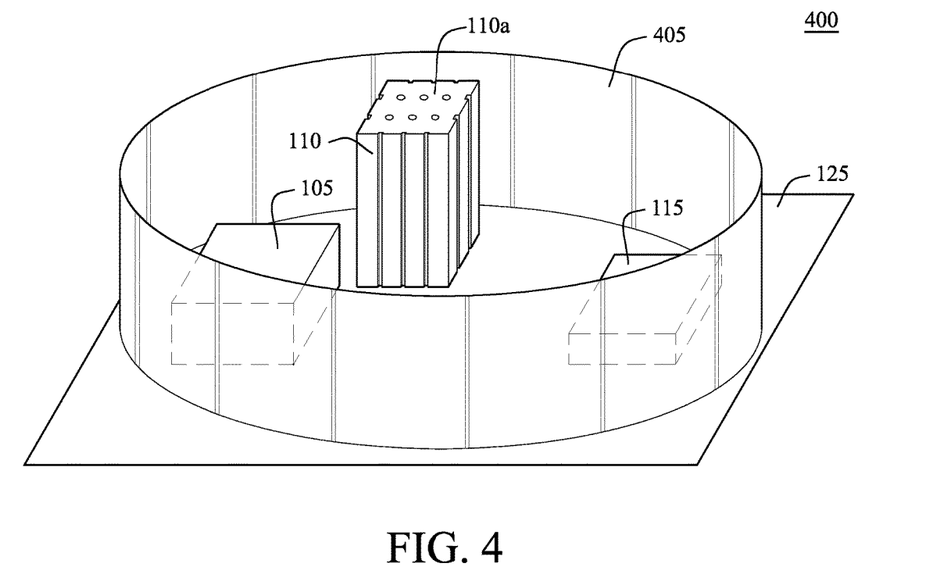
FIG. 4 illustrates a perspective view of the various electronic modules oriented on the first mounting surface including a mold barrier.

FIG. 4 illustrates a perspective view 400 of the various electronic modules 105, 110, and 115 oriented on the first mounting surface 125 and includes a ring mold 405. Ring mold 405 provides a barrier or a seal for subsequently disposed mold material. Ring mold 405 is shown as a circular shape, but it is appreciated that any suitable mold shape can be used, as appropriate. In preferred embodiments, ring mold 405 is a plate with a desired shape of a resultant wafer based module cutout. Similar to the bonding agent discussed above with respect to electronic modules and respective mounting surfaces, the mounting surfaces and the ring mold 405 are preferably releasably secured together using the same bonding agent to keep the ring mold 405 stable during the fabrication process.

Figure 5:
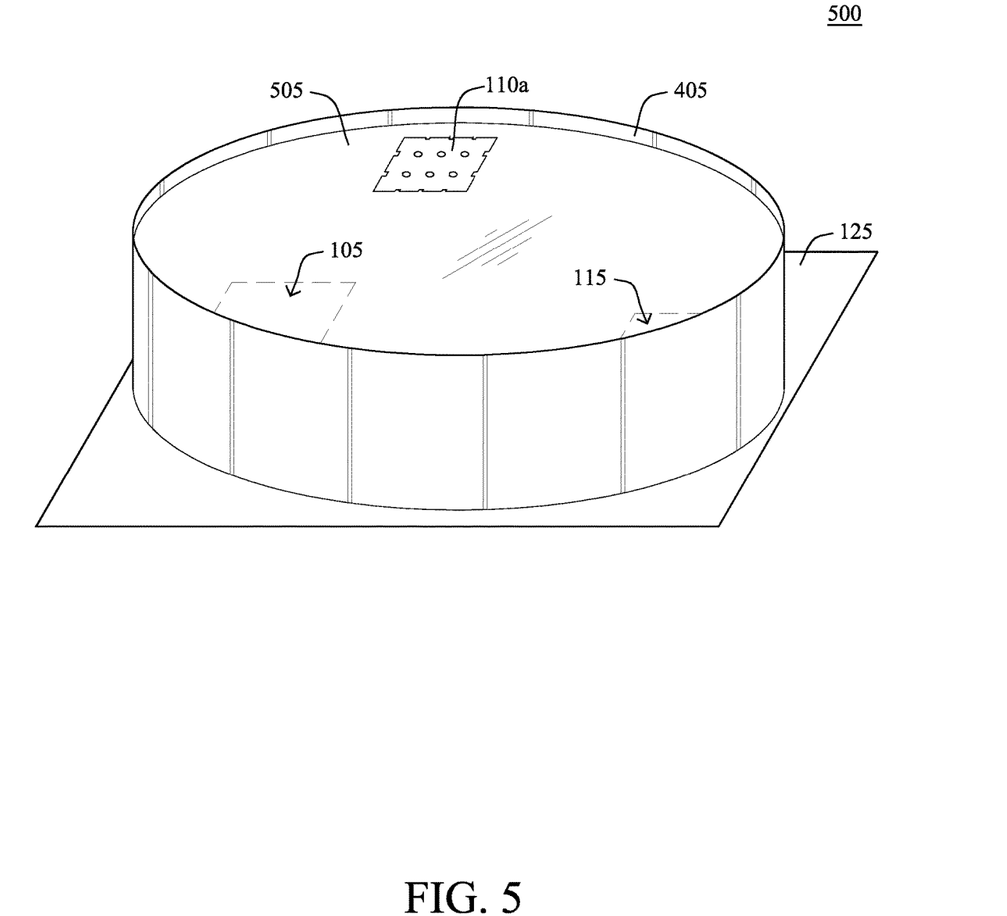
FIG. 5 illustrates a perspective view of the various electronic modules oriented on the first mounting surface substantially encapsulated by a mold material.

FIG. 5 illustrates a perspective view 500 of the various electronic modules 105, 110, and 115, oriented on the first mounting surface substantially encapsulated by a mold material 505. Mold material 505 is disposed within the ring mold 405 to substantially surround the electronic modules 105, 110 and 115. As shown, electrical contacts 110a for electronic module 110 remain exposed; however, in certain embodiments, the mold material 505 may cover such electrical contacts. Additional steps may be used to expose portions of the electrical contacts 110a prior to forming electrical layers for a resultant wafer based module. For example, portions of the mold material 505 can be removed by chemical etching, milling, routing, and the like.

Figure 6:
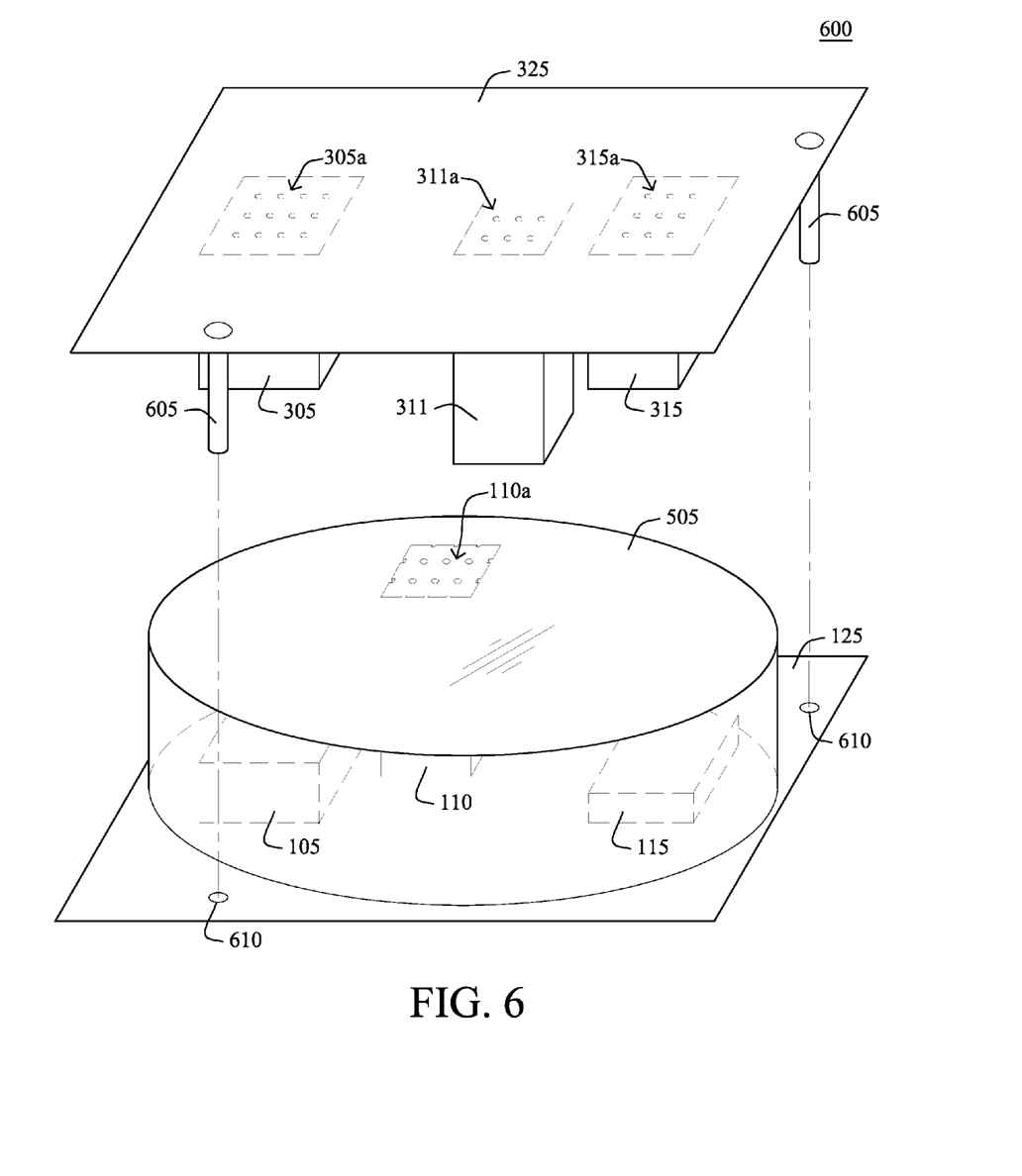
FIG. 6 illustrates a perspective view of the second mounting surface positioned relative to the first mounting surface, showing respective electronic components and the mold material shown in FIG. 5.

FIG. 6 illustrates a perspective view 600 of the second mounting surface 325 positioned relative to the first mounting surface 125, showing respective electronic components, and the mold material 505. Perspective view 600 particularly shows a step for combining the electronic modules 110, 115, and 120 of the first mounting surface 125 with the electronic modules 310, 311, and 315 of the second mounting surface 325 within a single mold material 505 prior to curing.

The electronic modules are placed on respective mounting surfaces such that during this subsequent combination or disposition of the electronic modules within the single mold material 505, the mold material surrounds each additional electronic module while maintaining a minimum distance there-between. Put differently, each electronic module requires certain spacing between next or adjacent chips for various reasons, including, for example, electronic module performance, mitigating potential damage to each electronic module during subsequent molding processes, such as stresses and strains due to thermal expansion, and the like. Additionally, as shown, first mounting surface 125 includes alignment pins 605, while second mounting surface 325 includes corresponding alignment receptacles that receive the alignment pins 605. As is appreciated by those skilled in the art, any type of alignment pin/alignment receptacle combination can be used, and those shown in FIG. 6 are for example purposes only. Additionally, ring mold 405 is absent from FIG. 6 for purposes of illustrating each mounting surface, respective electronic modules, and alignment pins/receptacles. However, in preferred embodiments, ring mold 405 (or another suitable barrier or seal) will remain around mold material 505 by the bonding agent discussed above when the electronic modules from respective mounting surfaces are disposed in the mold material 505. Moreover, as discussed above, electronic modules are releasably secured to respective mounting surfaces using, for example, a bonding agent such as Rev Alpha. During subsequent fabrication processes, e.g., curing, the electronic modules (and ring mold 405) are de-bonded or otherwise released from respective mounting surfaces, e.g., thermally released.

Figure 7:
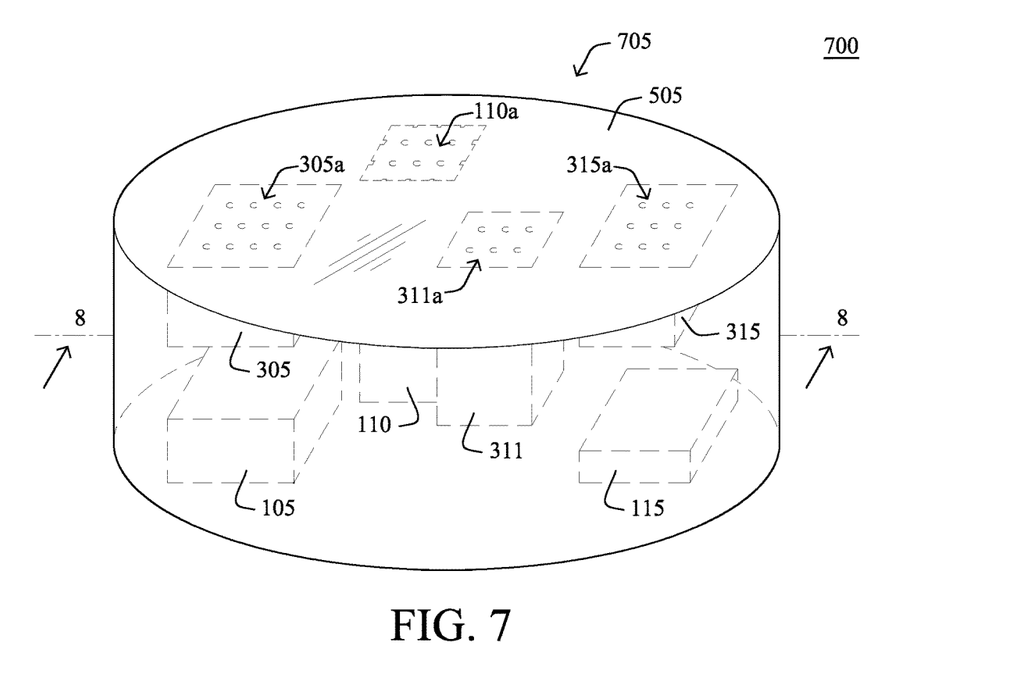
FIG. 7 illustrates a perspective view of a resultant wafer based module, when the first mounting surface and the second mounting surface are removed from the mold material.

FIG. 7 illustrates a perspective view 700 of a resultant wafer based module 705 after removing the first mounting surface 125 and the second mounting surface 325 from the mold material 505. As shown, wafer based module 705 includes electronic modules on two opposing sides—e.g., a top side and a bottom side, a front side and a back side, etc. Additionally, electrical contacts for corresponding electronic modules are exposed for subsequent electrical layering processes such as forming dielectric layers, top side and bottom side interconnection busses, and the like. One or more curing processes are typically employed to stabilize mold material 505, and also to release electronic modules from respective mounting surfaces, as discussed above.

Figure 8:
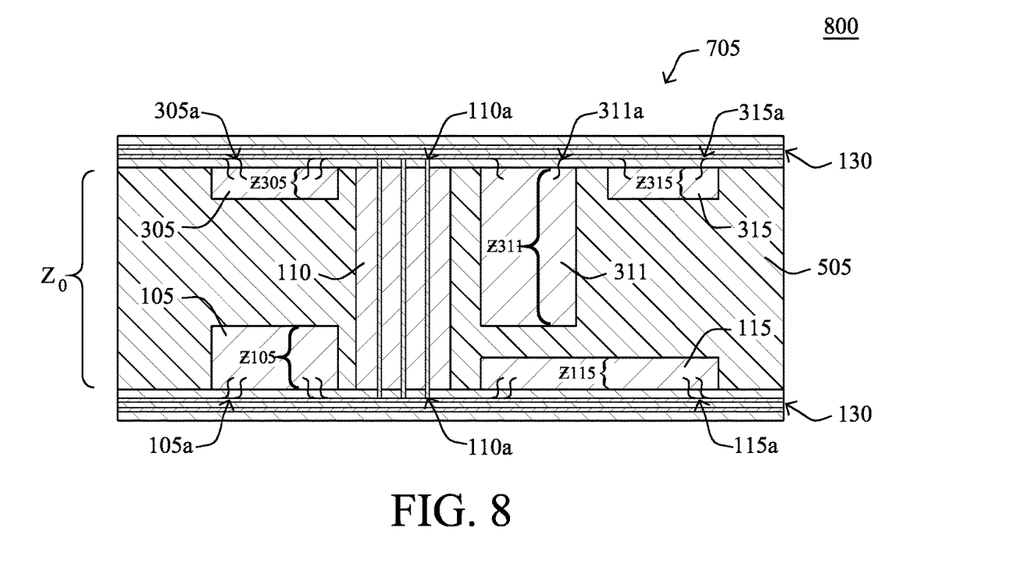
FIG. 8 illustrates a cross sectional view of the perspective shown in FIG. 7, viewed from cut lines 8-8.

FIG. 8 illustrates a cross sectional view 800 of the wafer based module 705 shown in FIG. 7, viewed from cut lines 8-8. As shown in FIG. 8, wafer based module 705 includes metal layers 130 formed on opposing sides, e.g., dielectric layers, interconnection layers, etc. Additionally, each electronic module includes electrical contacts, designated by the electronic module number and a letter "a"—105a, 110a, 115a, 305a, 311a, and 315a. These electrical contacts connect or otherwise electrically couple corresponding electronic modules to one or more of the metal layers.

Cross-sectional view 800 also illustrates relative height dimensions, "Z", for corresponding electronic modules, as well as an overall distance $Z_0$ between metal layers 130. As discussed above, electronic modules are oriented and disposed in mold material 505 to maintain a minimum distance there-between. Such minimum distance allows mold material 505 to substantially surround each electronic module, which is important for numerous reasons—e.g., overall performance of wafer based module 705, mitigating stress/strain during other fabrications processes, and the like. In addition to a minimum distance between electronic modules, the overall electronic module orientation and placement within mold material 505 also factors in respective volume for each electronic module. Based on respective volumes, electronic modules are placed and oriented on respective mounting surfaces to achieve substantially uniform volumes of electronic modules throughout a resultant wafer based module. Certain fabrication processes require curing the mold material 505 with the electronic modules disposed therein. Such curing processes typically require high temperatures for specified periods of time. The mold material 505 and each electronic module have thermal expansion coefficients corresponding to respective material properties. During curing, the mold material 505 and the electronic modules experience expansion and contraction according to these thermal expansion coefficients, which can result in undesired bowing or flexing of the overall wafer based module 705. Balancing and distributing the electronic modules within the mold material 505 according to respective volumes while accounting for differing thermal coefficients can substantially mitigate the undesired bowing or flexing of the resultant wafer device 705.

In sum, referring again to FIGS. 2-8, the fabrication processes for improved space utilization provide for a wafer based multi-chip module or semiconductor device having electronic modules oriented on two opposing sides of a single device (e.g., a top side and a bottom side). Particulars of this fabrication process are further illustrated in the exemplary procedure shown in FIGS. 9A-9B.

Figure 9A:
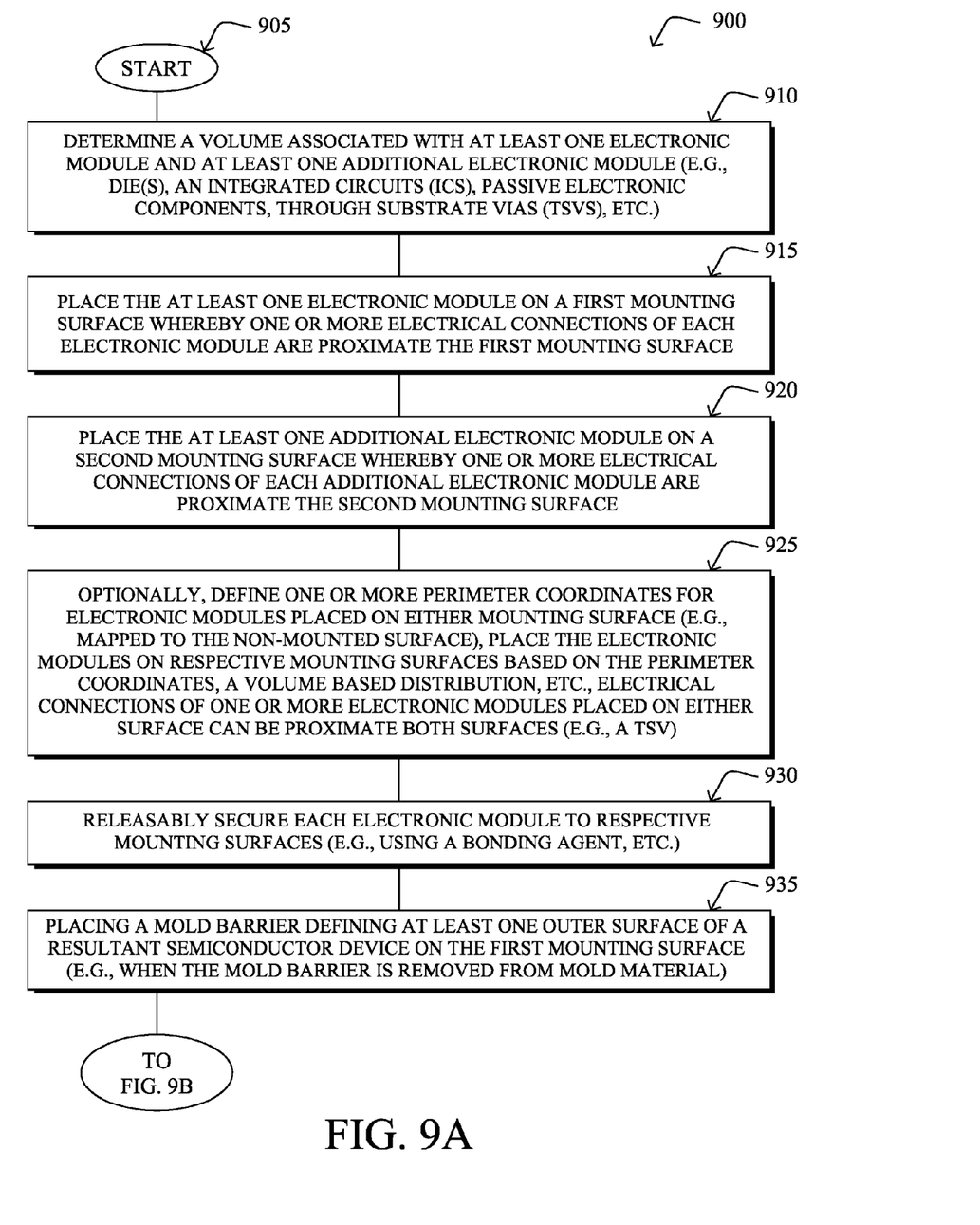
FIG. 9A illustrates steps 1-6 of 11 and FIG. 9B illustrates steps 7-11 of 11.
Figure 9B:
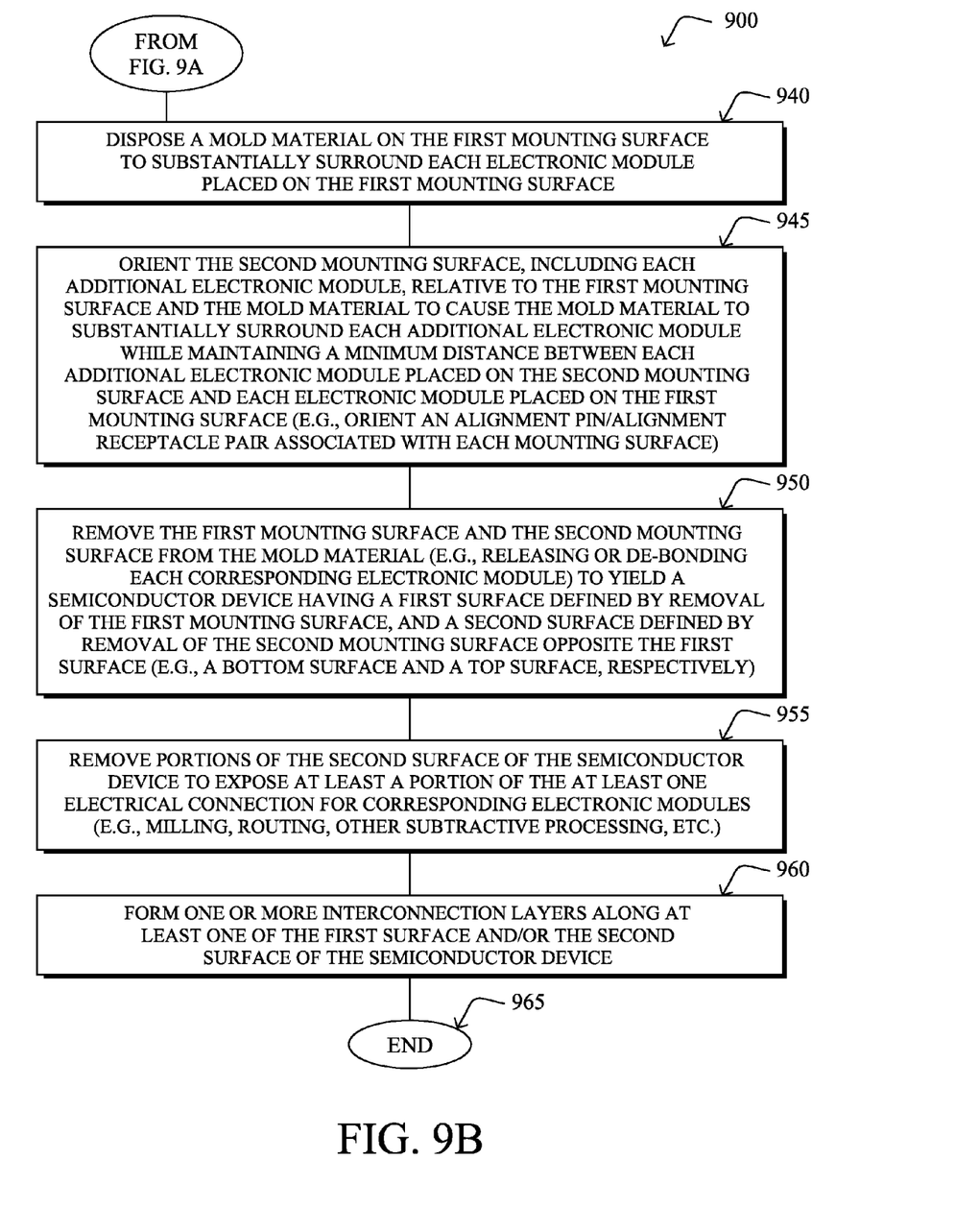

FIGS. 9A-9B illustrate an exemplary procedure 900 for forming a semiconductor device (i.e., semiconductor device 705) in accordance with one or more embodiments disclosed herein.

Procedure 900 begins in FIG. 9A, at step 905, and continues to step 910 where, as discussed above, a volume is determined for electronic modules for subsequent placement on a first mounting surface or a second mounting surface. Electronic modules include die, integrated circuits (ICs), passive electronic components, Through Substrate Vias (TSVs), and the like. As discussed above, the material comprising these electronic modules is associated with one or more thermal expansion coefficients. Depending on these thermal expansion co-efficient and the corresponding volume of the electronic module, the electronic modules increase or decrease in size during certain fabrication processes (e.g., curing at high temperatures). In turn, this change or delta in size can cause undesired bowing or flexing in a resultant semiconductor device. Accordingly, the volume for electronic modules is one metric used to proportionally distribute electronic modules in a mold material thereby mitigating undesired bowing or flexing.

Procedure 900 continues to steps 915 and 920, where at least one electronic module is placed on a first mounting surface (915) and at least one electronic module is placed on a second mounting surface (920). According to respective steps 915 and 920, the at least one electronic module and the at least one additional electronic module are placed on respective mounting surfaces such that electrical connections of each electronic module are proximate the respective mounting surface (e.g., a face-down orientation).

Next, in step 920, additional options for placing the electronic modules on respective mounting surfaces are provided. In particular, as discussed above certain electronic modules—TSVs—preferably have electrical connections proximate to each mounting surface. Accordingly, one or more perimeter coordinates (310) can be defined on corresponding mounting surfaces so as to avoid overlapping placement of electronic modules. Further, step 920 also describes placing electronic modules on a volume distribution, which mitigates undesired flexing or bowing of a resultant semiconductor device. As discussed above, electronic modules can be placed on the first or second mounting surface and later disposed in a mold material (discussed below) in a proportionate volume or other specified volume to account for thermal expansion during other fabrication processes, e.g., curing.

Preferably, the electronic modules are releasably secured to respective mounting surfaces using a bonding agent such as adhesive tape, described in step 925. As discussed above, once disposed in the mold material and cured, the bonding agent degrades to release respective electronic modules from the mounting surfaces.

With the electronic modules properly placed on respective mounting surfaces, the fabrication process continues to step 930, where a mold barrier (i.e., ring mold 405) is placed on one of the mounting surfaces. The mold barrier, as discussed above, forms a seal, in step 935, around subsequently disposed mold material and further defines an outer surface of the resultant semiconductor device when removed. The mold material is disposed within the mold barrier so as to substantially surround each electronic module placed on the corresponding mounting surface.

Process 900 continues on to step 940 in FIG. 9B, where the mounting surface without the mold barrier—here, the second mounting surface—is oriented relative to the mounting surface with the ring barrier placed thereon—here, the first mounting surface. In particular, the second mounting surface, including the corresponding electronic modules, are oriented relative to the first mounting surface to cause the mold material to substantially surround each additional electronic module of the second mounting surface, while maintaining a minimum distance between electronic modules for both mounting surfaces. In certain embodiments, the mounting surfaces can have matching alignment pins/receptacle to facilitate this step.

Next, in step 945, the mounting surfaces are removed from the mold material to yield a semiconductor device. The electronic modules for each mounting surface are released or de-bonded prior to the mounting surface removal (e.g., by curing processes). Additionally, the semiconductor device has a first surface and a second surface defined by removal of the first mounting surface and removal of the second mounting surface, respectively. Typically, the second surface is opposite that of the first surface. As discussed above, these surfaces can be called a bottom surface and top surface, or a back surface and a front surface, respectively.

In certain embodiments, portions of the first surface and the second surface may be removed to expose portions of electrical connections for corresponding electronic modules. Such processes can include subtractive processing, milling, routing, and the like.

Further, one or more interconnection layers (layers 130) can be formed in step 955 along the first surface and/or the second surface of the semiconductor device. These interconnection layers can include, for example, dielectric layers, interconnection buses and the like. Electrical connections for electronic modules are electrically coupled to these layers, as appropriate.

Procedure 900 subsequently ends at step 960, but may begin again at step 910 where, as discussed above, a volume for electronic modules is determined.

It should be noted that while certain steps within procedure 900 may be optional as described above, the steps shown in FIGS. 9A-B are merely examples for illustration, and certain other steps may be included or excluded as desired. Further, while a particular order of the steps are shown, this ordering is merely illustrative, and any suitable arrangement of the steps may be utilized without departing from the scope of the embodiments herein.

The techniques described herein improve space utilization for high density wafer based modules. These techniques provide a single semiconductor device having electronic modules disposed on two opposing sides, which advantageously overcomes limitations of conventional techniques, which require stacking additional modules together to achieve certain functionality.

While the foregoing description has been directed to specific embodiments, it will be apparent, however; that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A wafer based module, comprising:
   at least one electronic module having one or more electrical connections oriented proximate a bottom surface of the wafer based module;
   at least one additional electronic module having one or more electrical connections oriented proximate a top surface of the wafer based module;
   a single mold material that is disposed within a ring mold and is unitarily formed to substantially surround each of the at least one electronic module and each of the at least one additional electronic module, the single mold material defining the bottom surface and the top surface of the wafer based module, the single mold material extending between the top surface and the bottom surface; and
   one or more metallic layers formed on each of the bottom surface and the top surface, the one or more metallic layers coupled to corresponding portions of the one or more electrical connections of the at least one electronic module and the at least one additional electronic module, wherein the one or more electrical connections of the at least one electronic module and the one or more electrical connections of the at least one additional electronic module are exposed.

2. The wafer based module of claim 1, wherein the at least one electronic module is a Through Substrate Via further having one or more electrical connections oriented proximate the top surface of the wafer based module.

3. The wafer based module of claim 1, wherein the at least one electronic module and the at least one additional electronic module are disposed within the single mold material according to a volume based distribution.

4. The wafer based module of claim 1, further comprising a second electronic module oriented proximate the bottom surface adjacent the at least one electronic module defining a space therebetween, wherein the at least one additional electronic module extends into the defined space.

5. The wafer based module of claim 1, wherein the metallic layers are formed on substantially the entire bottom surface and substantially on the entire top surface.

6. The wafer based module of claim 1, wherein the single mold material substantially surrounds each of the at least one electronic module and each of the at least one additional electronic module such that the single mold material extends between adjacent electronic modules.

* * * * *